(12) United States Patent
Sejima

(10) Patent No.: US 9,970,992 B2
(45) Date of Patent: May 15, 2018

(54) STATE ESTIMATION DEVICE, ENERGY STORAGE MODULE, VEHICLE, AND STATE ESTIMATION METHOD

(71) Applicant: GS Yuasa International Ltd., Kyoto-shi (JP)

(72) Inventor: Kenichi Sejima, Kyoto (JP)

(73) Assignee: GS YUASA INTERNATIONAL LTD., Kyoto-Shi, Kyoto (JP)

( * ) Notice: Subject to any disclaimer, the term of this patent is extended or adjusted under 35 U.S.C. 154(b) by 0 days. days.

(21) Appl. No.: 15/415,647

(22) Filed: Jan. 25, 2017

(65) Prior Publication Data

US 2017/0212171 A1    Jul. 27, 2017

(30) Foreign Application Priority Data

Jan. 26, 2016   (JP) ................. 2016-012262

(51) Int. Cl.
  *G01R 31/36* (2006.01)
  *B60L 11/18* (2006.01)
  *H02J 7/00* (2006.01)
(52) U.S. Cl.
  CPC ...... *G01R 31/3658* (2013.01); *B60L 11/1866* (2013.01); *G01R 31/3648* (2013.01); *H02J 7/0016* (2013.01); *G01R 31/3637* (2013.01)
(58) Field of Classification Search
  CPC .... G01R 31/00; G01R 31/36; G01R 31/3606; G01R 31/3627; G01R 31/3634; G01R 31/3637; G01R 31/3644; G01R 31/3648; G01R 31/3658; G01R 31/3679;
(Continued)

(56) References Cited

U.S. PATENT DOCUMENTS 5,363,312 A * 11/1994 Ninomiya ............... G06F 1/263
                                              320/155
5,684,404 A * 11/1997 Millar ................. G01R 31/3648
                                              324/426
(Continued)

FOREIGN PATENT DOCUMENTS

JP     2010-088194 A    4/2010
JP     2011-041452 A    2/2011
(Continued)

*Primary Examiner* — Hoai-An D Nguyen
(74) *Attorney, Agent, or Firm* — McGinn IP Law Group, PLLC

(57) ABSTRACT

A state estimation device includes: a voltage detecting unit that detects voltages of energy storage devices; and an estimating unit that estimates a charge amount difference between at least two of the energy storage devices. At a reference time point T0 during constant current charging, the estimating unit performs: specific voltage setting for setting, as a specific voltage V0, a voltage of a low-voltage energy storage device at the reference time point T0; time obtaining for obtaining a time point at which a voltage of a high-voltage energy storage device reaches the specific voltage V0; and charge amount difference estimating for estimating the charge amount difference between the at least two energy storage devices based on the reference time point T0, the time point obtained in the time obtaining process, and a current flowing through the plurality of energy storage devices during the constant current charging.

8 Claims, 11 Drawing Sheets

(58) Field of Classification Search
CPC ............. G01R 31/3682; B60L 11/1851; B60L 11/1864; B60L 11/1866; H02J 7/0016
USPC ....... 324/425, 426, 432, 433, 434, 500, 522, 324/713, 76.11, 98; 320/120, 128, 131, 320/132, 134, 136; 702/1, 57, 64
See application file for complete search history.

(56) References Cited

U.S. PATENT DOCUMENTS

| | | | | |
|---|---|---|---|---|
| 7,233,128 | B2* | 6/2007 | Brost | G01R 31/3648 320/132 |
| 7,679,335 | B1* | 3/2010 | Collins | H02J 7/0013 320/125 |
| 8,093,866 | B2* | 1/2012 | Karoui | H01M 10/44 320/141 |
| 8,773,069 | B2* | 7/2014 | Tanno | H01M 10/44 320/116 |
| 8,972,765 | B1* | 3/2015 | Krolak | H02J 7/0018 320/149 |
| 9,705,349 | B2* | 7/2017 | Takano | H02J 7/007 |
| 2005/0110466 | A1* | 5/2005 | Shoji | G01R 31/3624 320/150 |
| 2009/0128159 | A1* | 5/2009 | Nakatsuji | G01R 31/025 324/433 |
| 2009/0134843 | A1* | 5/2009 | Mizuno | B60L 11/1861 320/134 |
| 2010/0217466 | A1* | 8/2010 | Ichikawa | B60K 6/48 701/22 |
| 2011/0011653 | A1* | 1/2011 | Mizutani | B60L 11/1864 180/65.1 |
| 2011/0050169 | A1 | 3/2011 | Akiba et al. | |
| 2012/0169291 | A1* | 7/2012 | Abe | H01M 10/44 320/134 |
| 2013/0063080 | A1 | 3/2013 | Shiraishi | |
| 2013/0063089 | A1 | 3/2013 | Shiraishi | |
| 2014/0015483 | A1 | 1/2014 | Tagaya et al. | |
| 2014/0132204 | A1* | 5/2014 | Hong | G01R 31/3606 320/107 |
| 2014/0324370 | A1* | 10/2014 | Underhill | G01R 31/3648 702/63 |
| 2014/0368208 | A1* | 12/2014 | Yamada | H01M 10/48 324/433 |
| 2015/0293181 | A1* | 10/2015 | Kaneno | H01M 10/48 324/426 |
| 2015/0362557 | A1* | 12/2015 | Takashima | H01M 10/48 324/426 |
| 2015/0372514 | A1* | 12/2015 | Kobayashi | H01M 10/482 320/134 |
| 2016/0003917 | A1* | 1/2016 | You | G01R 31/3679 702/63 |

FOREIGN PATENT DOCUMENTS

| | | |
|---|---|---|
| JP | 2011-097820 A | 5/2011 |
| JP | 2013-070599 A | 4/2013 |
| JP | 2013-070600 A | 4/2013 |
| JP | 2014-017997 A | 1/2014 |
| JP | 2015-023698 A | 2/2015 |
| JP | 2015-136268 A | 7/2015 |
| JP | 2016-171658 A | 9/2016 |

* cited by examiner

STATE ESTIMATION DEVICE, ENERGY STORAGE MODULE, VEHICLE, AND STATE ESTIMATION METHOD

CROSS-REFERENCE TO RELATED APPLICATIONS

This application claims the benefit of Japanese patent application No. 2016-012262, filed on Jan. 26, 2016, which is incorporated by reference.

FIELD

The technique disclosed herein relates to a state estimation device, an energy storage module, a vehicle, and a state estimation method.

BACKGROUND

In an assembled battery having a plurality of energy storage devices connected in series, charge amounts of the energy storage devices may often vary (a charge amount difference may be caused) due to such reasons as differences in initial capacities and degrees of deterioration between the energy storage devices. When a charge amount difference is produced between the energy storage devices, overvoltage occurs during charging in an energy storage device whose charge amount is relatively large. Therefore, conventionally, there is known a technique for equalizing charge amounts by estimating a charge amount difference between energy storage devices, and by discharging (or charging) each of the energy storage devices based on the charge amount difference (JP 2011-41452 A). JP 2011-41452 A discloses a method of obtaining time points at which voltages of the corresponding energy storage devices reach a specific voltage, and estimating the charge amount difference based on differences between the time points.

However, according to the method of JP 2011-41452 A, the specific voltage is set to an arbitrary static value. This leads to a problem that a voltage of an energy storage device may often not reach the specific voltage depending on the setting value of the specific voltage, and a charge amount difference of the energy storage devices may not be estimated.

SUMMARY

The following presents a simplified summary of the invention disclosed herein in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present disclosure provides a technique capable of estimating a charge amount difference of energy storage devices more reliably.

According to an aspect of the present invention, there is provided a state estimation device that estimates a state of a plurality of energy storage devices, the state estimation device including: a voltage detecting unit configured to detect voltages of the energy storage devices, respectively; and an estimating unit configured to estimate a charge amount difference between at least two of the energy storage devices, wherein at a reference time point T0 during constant current charging to the plurality of energy storage devices, in a case in which one of the two energy storage devices whose voltage is relatively low is assumed to be a low-voltage energy storage device, and the other of the two energy storage devices whose voltage is relatively high is assumed to be a high-voltage energy storage device, the estimating unit performs: a specific voltage setting process for setting, as a specific voltage V0, a voltage of the low-voltage energy storage device detected by the voltage detecting unit at the reference time point T0; a time obtaining process for obtaining a time point at which a voltage of the high-voltage energy storage device reaches the specific voltage V0; and a charge amount difference estimating process for estimating the charge amount difference between the at least two energy storage devices based on the reference time point T0, the time point obtained in the time obtaining process, and a current flowing through the plurality of energy storage devices during the constant current charging.

According to the configuration, it is possible to estimate a charge amount difference of energy storage devices more reliably.

BRIEF DESCRIPTION OF DRAWINGS

The foregoing and other features of the present invention will become apparent from the following description and drawings of an illustrative embodiment of the invention in which.

DESCRIPTION OF EMBODIMENTS (Outline of Embodiments)

Figure 1:
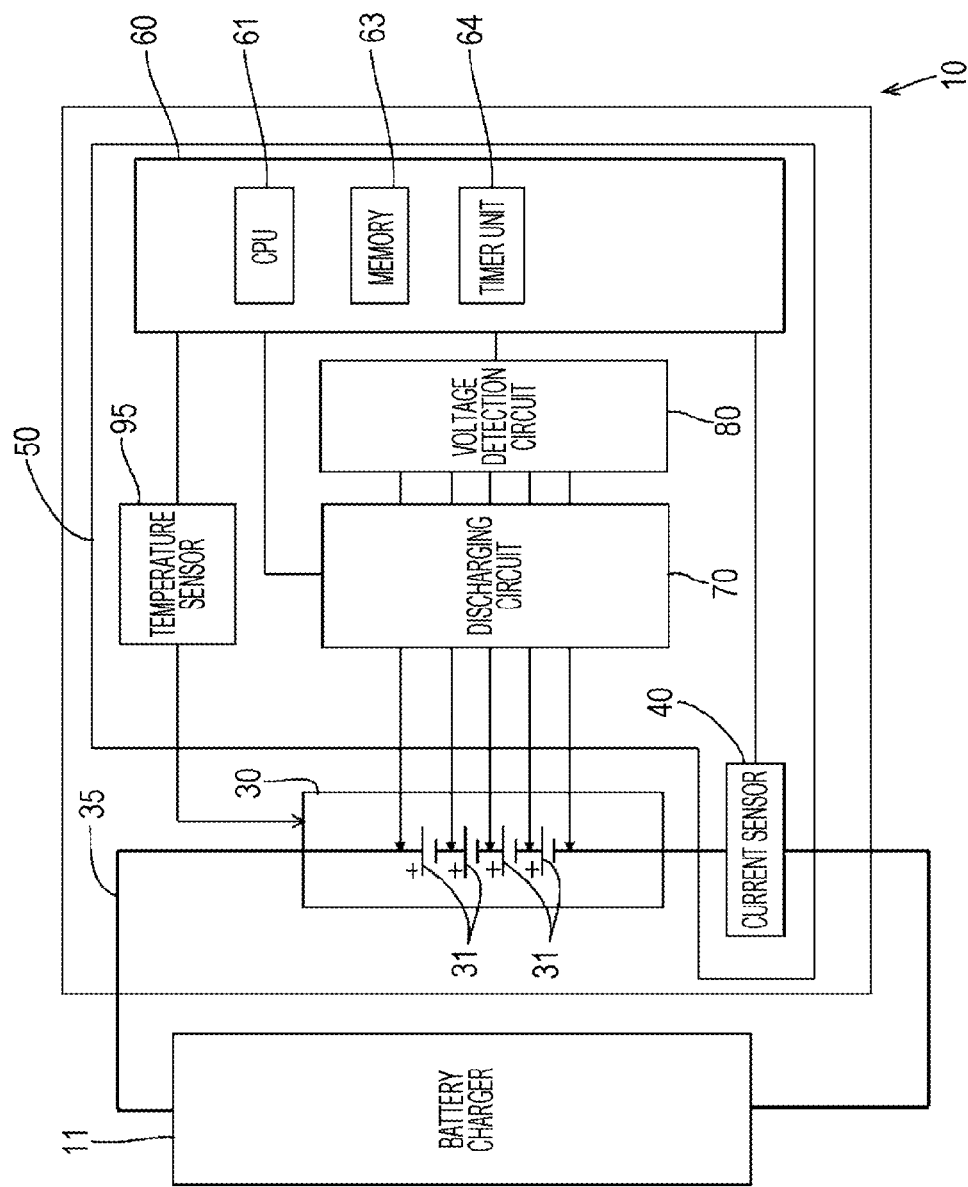
FIG. 1 shows a block diagram illustrating a charging system.

First, an outline of the technique disclosed in the embodiments will be described.

The state estimation device disclosed herein is a state estimation device that estimates a state of a plurality of energy storage devices, the state estimation device including: a voltage detecting unit configured to detect voltages of the energy storage devices, respectively; and an estimating unit configured to estimate a charge amount difference between at least two of the energy storage devices, wherein at a reference time point T0 during constant current charging to the plurality of energy storage devices, in a case in which one of the two energy storage devices whose voltage is relatively low is assumed to be a low-voltage energy storage device, and the other of the two energy storage devices whose voltage is relatively high is assumed to be a high-voltage energy storage device, the estimating unit performs: a specific voltage setting process for setting, as a specific voltage V0, a voltage of the low-voltage energy storage device detected by the voltage detecting unit at the reference time point T0; a time obtaining process for obtaining a time point at which a voltage of the high-voltage energy storage device reaches the specific voltage V0; and a charge amount difference estimating process for estimating the charge amount difference between the at least two energy storage devices based on the reference time point T0, the time point obtained in the time obtaining process, and a current flowing through the plurality of energy storage devices during the constant current charging.

By setting a voltage of one of the two energy storage devices whose voltage is low as a specific voltage, it is possible to reliably obtain the time point reaching the specific voltage, as the voltage of the other energy storage device (an energy storage device whose voltage is relatively high) has already reached the specific voltage. With this, it is possible to calculate the time difference between time points reaching the specific voltage for the two energy storage devices, and to reliably estimate the charge amount difference based on the time difference. Here, the reference time point T0 during constant current charging includes a time point at an end of the constant current charging. In the meantime, during constant voltage charging, the current flowing through the energy storage devices keeps changing. Therefore, the energy storage devices have different current values at the time point reaching the specific voltage, and their charging states when their voltages have reached the specific voltage are hardly the same. Accordingly, in the case of constant voltage charging, it is difficult to estimate the charge amount differences based on the time differences between the time points at which the voltages of the energy storage devices reach the specific voltage. On the other hand, in the case of constant current charging, as current values when the voltages of the energy storage devices reach the specific voltage are the same, their charging states when their voltages have reached the specific voltage are considered to be the same. Therefore, by multiplying the time differences between the time points at which the voltages of the energy storage devices reach the specific voltage by the current value of the constant current charging, it is possible to estimate charge amount differences between the energy storage devices. Specifically, the technique disclosed herein may be applied when constant current charging is performed.

Further, the state estimation device disclosed herein may be configured such that the plurality of energy storage devices include three or more energy storage devices, and in a case in which one of the plurality of energy storage devices whose voltage is lowest at the reference time point T0 is assumed to be a lowest-voltage energy storage device, the estimating unit: sets, in the specific voltage setting process, a voltage of the lowest-voltage energy storage device as the specific voltage V0; obtains, in the time obtaining process, time points at which voltages of the plurality of energy storage devices other than the lowest-voltage energy storage device reach the specific voltage V0; and estimates, in the charge amount difference estimating process, the charge amount differences between the plurality of energy storage devices based on the reference time point T0, the time points obtained in the time obtaining process, and a current flowing through the plurality of energy storage devices during the constant current charging. With such a configuration, by setting the voltage of the energy storage device whose voltage at the reference time point T0 is lowest to be the specific voltage, it is possible to reliably obtain the time points at which the voltages of the plurality of energy storage devices reached the specific voltage.

Moreover, the state estimation device disclosed herein may be configured such that the estimating unit: performs a time difference calculating process for calculating time differences between the reference time point T0 and the time points obtained in the time obtaining process; and estimates, in the charge amount difference estimating process, the charge amount differences between the lowest-voltage energy storage device and the energy storage devices other than the lowest-voltage energy storage device based on the time differences calculated in the time difference calculating process. With such a configuration, it is possible to estimate the charge amount differences between the energy storage devices based on the lowest-voltage energy storage device.

Furthermore, the state estimation device disclosed herein may be configured such that the plurality of energy storage devices include three or more energy storage devices, and in a case in which one of the plurality of energy storage devices whose voltage is highest at the reference time point T0 is assumed to be a highest-voltage energy storage device, the estimating unit: sets, in the specific voltage setting process, voltages of the plurality of energy storage devices other than the highest-voltage energy storage device as specific voltages V0; obtains, in the time obtaining process, time points at which a voltage of the highest-voltage energy storage device reaches the specific voltages V0 that have been set in the specific voltage setting process; and estimates, in the charge amount difference estimating process, the charge amount differences between the plurality of energy storage devices based on the reference time point T0, the time points obtained in the time obtaining process, and a current flowing through the plurality of energy storage devices during the constant current charging.

In order to obtain the time points at which the voltages of the energy storage devices reach the specific voltage V0, it is necessary to record temporal change of the voltages of the energy storage devices. According to the above configuration, it is necessary to obtain only the temporal change of the voltage of the energy storage device whose voltage is highest, and therefore it is possible to reduce an amount of data to be recorded.

Moreover, the state estimation device disclosed herein may be configured such that in a case in which one of the plurality of energy storage devices whose voltage is lowest at the reference time point T0 is assumed to be a lowest-voltage energy storage device, the estimating unit: performs a time difference calculating process for calculating a time difference between a time point T1 and the reference time point T0 and time differences between the time point T1 and the time points other than the time point T1 obtained in the time obtaining process, the time point T1 being a time point at which a voltage of the highest-voltage energy storage device reaches the specific voltage V0 of the lowest-voltage energy storage device; and estimates, in the charge amount difference estimating process, the charge amount differences between the lowest-voltage energy storage device and the energy storage devices out of the plurality of energy storage devices other than the lowest-voltage energy storage device, based on the time differences calculated in the time difference calculating process. With such a configuration, it is possible to estimate the charge amount differences between the energy storage devices based on the lowest-voltage energy storage device.

An energy storage module disclosed herein includes: the plurality of energy storage devices; and the state estimation device as described above.

A vehicle disclosed herein includes: the energy storage module as described above; and a vehicle load to which power is supplied from the energy storage module.

A state estimation method disclosed herein is a state estimation method for estimating a state of a plurality of energy storage devices, the method including: setting, at a reference time point T0 during constant current charging to the plurality of energy storage devices, a voltage of a low-voltage energy storage device as a specific voltage V0, wherein one of at least two of the plurality of energy storage devices is the low-voltage energy storage device whose voltage is relatively low and the other of the two energy storage devices is a high-voltage energy storage device whose voltage is relatively high; obtaining a time point at which a voltage of the high-voltage energy storage device reaches the specific voltage V0; and estimating a charge amount difference between the at least two energy storage devices based on the reference time point T0, the time point obtained in the time obtaining, and a current flowing through the plurality of energy storage devices during the constant current charging.

The technique disclosed herein may be applied, for example, to a computer program for estimating a state of a plurality of energy storage devices.

First Embodiment

Hereinafter, a first embodiment in which the technique disclosed herein is applied to a charging system 10 will be described with reference to FIG. 1 through FIG. 5.

1. Configuration of Charging System 10

As illustrated in FIG. 1, the charging system 10 includes an assembled battery 30, a battery management device 50 (hereinafter referred to as a BM) that manages the assembled battery 30, and a battery charger (power generator) 11 for charging the assembled battery 30.

Figure 2:
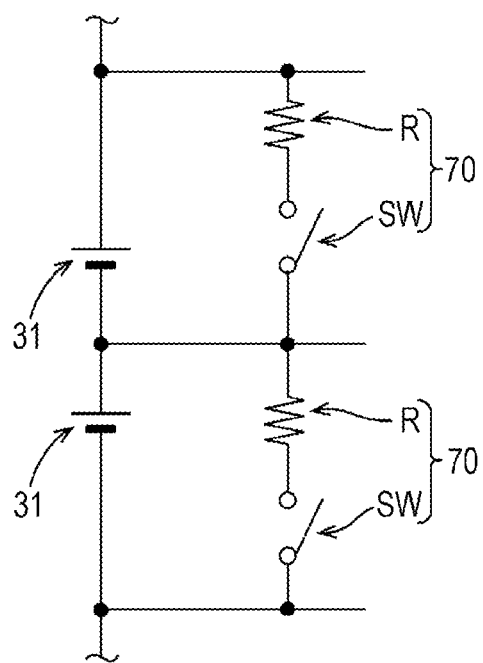
FIG. 2 shows a circuit diagram of a discharging circuit.

The assembled battery 30 includes a plurality of secondary batteries 31 that are connected in series. As illustrated in FIG. 1, the BM 50 includes a controller 60, a discharging circuit 70, a voltage detection circuit 80, a current sensor 40, and a temperature sensor 95. The discharging circuit 70 is provided for each of the secondary batteries 31. As illustrated in FIG. 2, the discharging circuit 70 includes a discharge resistance R and a discharge switch SW, and is connected in parallel with the secondary batteries 31. By supplying a command from the controller 60 to turn the discharge switch SW on, the secondary batteries 31 may be discharged separately.

As illustrated in FIG. 1, the voltage detection circuit 80 is connected via a detection line to both ends of the secondary batteries 31, and serves a function of measuring a voltage of each of the secondary batteries 31 in response to an instruction from the controller 60. The temperature sensor 95 is contact-type or contactless-type, and serves a function of measuring temperature of the secondary batteries 31. Here, the secondary batteries 31 are one example of "energy storage devices", and the BM 50 is one example of a "state estimation device". Further, the voltage detection circuit 80 is one example of a "voltage detecting unit".

The current sensor 40 serves a function of detecting a current flowing through the secondary batteries 31. The current sensor 40 is configured to measure current values of the secondary batteries 31 at a constant frequency, and to transmit data for the measured current value to the controller 60. The secondary batteries 31 and the current sensor 40 are connected in series via wiring 35, and connected to the battery charger 11.

The controller 60 includes a central processing unit (hereinafter referred to as a CPU) 61, a memory 63, and a timer unit 64. The controller 60 serves a function of controlling the discharging circuit 70 to equalize charge amounts of each of the secondary batteries 31. The term "equalization" herein refers to a case of equalizing the charge amounts of the secondary batteries 31, as well as to a case of reducing a difference between the charge amounts of the secondary batteries 31. Here, the controller 60 is one example of an "estimating unit".

The memory 63 records a computer program for executing a process of equalizing charge amounts of the secondary batteries 31 ("sequence for executing equalization control" that will be later described), and the like. The timer unit 64 serves a function of keeping time of the assembled battery 30 during charging. Further, in addition to the components described above, the charging system 10 includes an operating unit (not illustrated) for accepting input from an operator and a display unit (not illustrated) for displaying states and the like of each of the secondary batteries 31.

Figure 3:
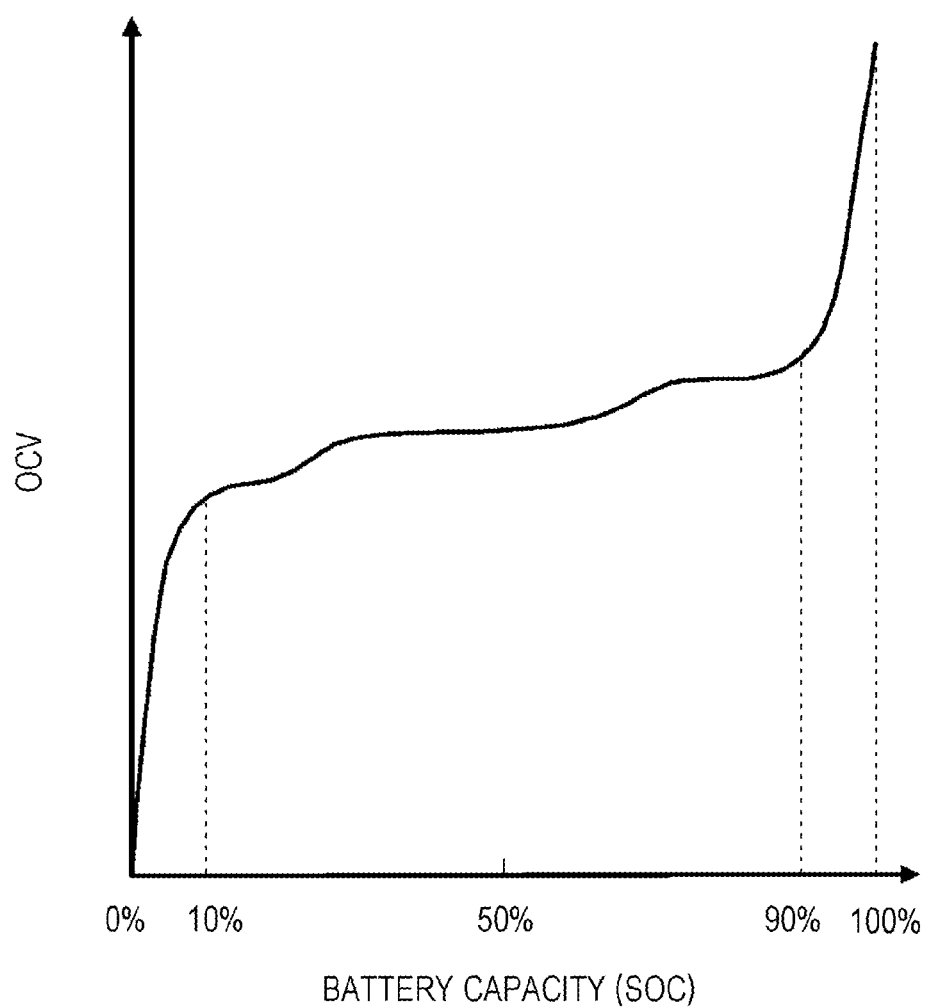
FIG. 3 shows a chart showing an SOC-OCV correlation characteristic of secondary batteries.

The each secondary battery 31 is, for example, an iron-phosphate-based lithium ion secondary battery that employs lithium iron phosphate (LiFePO4) as a positive active material and graphite as a negative active material. FIG. 3 shows an SOC-OCV correlation characteristic of the secondary battery 31. As illustrated in FIG. 3, the secondary battery 31 include a low-change region in which a change amount of OCV to a change amount of SOC is relatively low, and a high-change region in which a change amount of OCV to a change amount of SOC is relatively high.

Specifically, as illustrated in FIG. 3, the secondary battery 31 includes a region in which the OCV (open voltage) quickly increases with respect to an increase of the SOC (high-change region) in an early stage of charging (an ending stage of discharging) in which SOC is lower than 10% and an ending stage of charging in which SOC is 90% or higher. Further, the secondary battery 31 includes a region in which the OCV is substantially constant with respect to the increase of the SOC (low-change region, plateau region) in a middle stage of charging (a middle stage of discharging) in which SOC is 10% or more and lower than 90%.

If there is a charge amount difference (a difference in residual capacities) in the plurality of secondary batteries 31 having such a characteristic, overvoltage occurs in the ending stage of charging in one of the secondary batteries 31 whose charge amount is relatively large, and may cause deterioration. Therefore, equalization control is often performed to the assembled battery 30, for example, before shipment.

Here, when the assembled battery 30 is charged by using equipment capable of separately controlling voltages of the secondary batteries 31, it is possible to suppress overvoltage occurring in a specific one of the secondary batteries 31. However, the assembled battery 30 is often used without using such equipment. By equalizing charge amounts of the secondary batteries 31, it is possible to suppress overvoltage occurring in the secondary batteries 31 even when equipment that can separately control voltages of the secondary batteries 31 is not provided.

2. Sequence for Executing Equalization Control

Next, a sequence for executing equalization control for the assembled battery 30 will be described. The sequence for executing equalization control shown in FIG. 4 includes Steps S10 to S90. Specifically, in this embodiment, a charge amount difference of the secondary batteries 31 is estimated after constant current charging is performed to the assembled battery 30, and an equalization process is performed based on the charge amount difference. Here, the equalization control is executed to the assembled battery 30 before shipment, for example, but timing at which the equalization control is executed is not limited to the timing before shipment. Further, the following describes an example in which the assembled battery 30 includes four secondary batteries 31.

<Process During Constant Current Charging>

Figure 4:
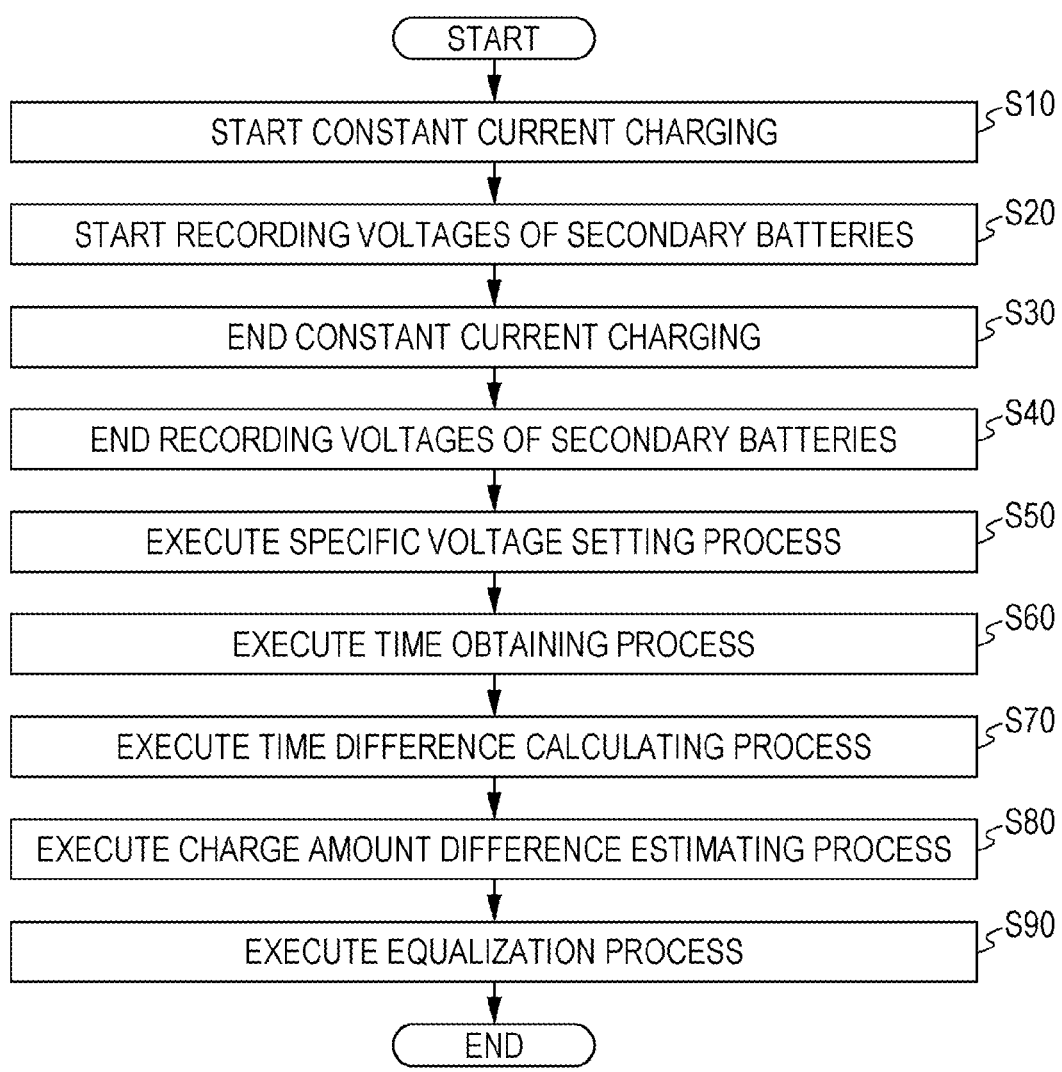
FIG. 4 shows a flowchart showing a process for equalization control.

As illustrated in FIG. 4, for example, when the assembled battery 30 is connected to the battery charger 11 by an operator and constant current charging of the assembled battery 30 from the battery charger 11 starts (S10), the CPU 61 records voltage values of the secondary batteries 31 in the memory 63 (S20). Specifically, the CPU 61 records time kept by the timer unit 64 (for example, time based on time when the constant current charging starts) and the voltage values of the secondary batteries 31 at this time in association in the memory 63. Then, upon completion of the constant current charging of the assembled battery 30 from the battery charger 11 (S30), the CPU 61 stops recording of the voltage values of the secondary batteries 31 (S40).

Figure 5:
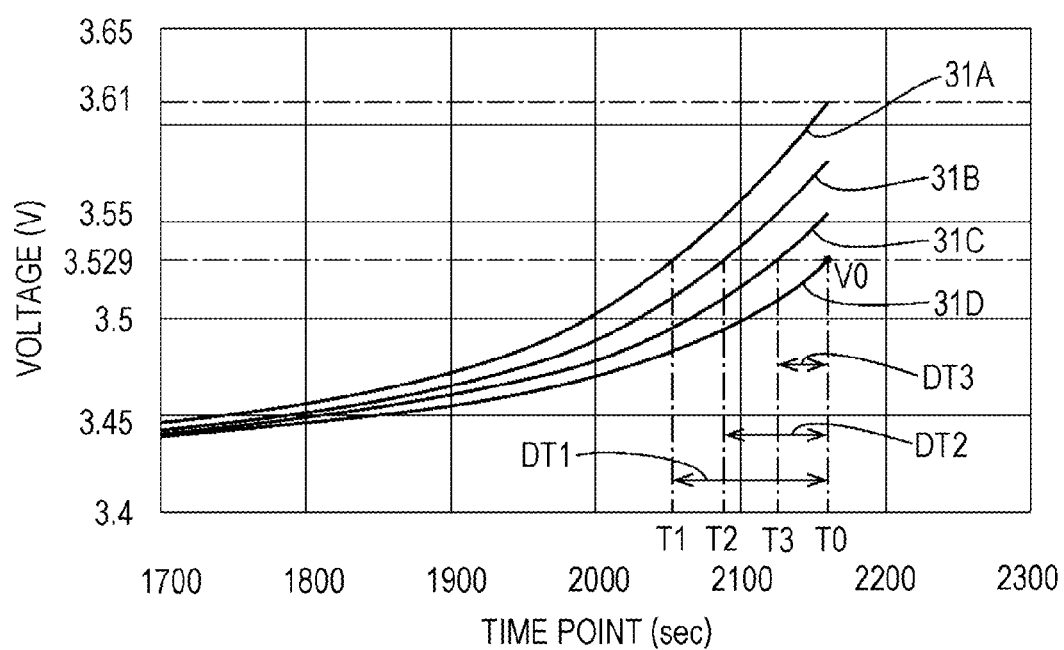
FIG. 5 shows a chart showing temporal change of voltage values of the secondary batteries at an ending stage of constant current charging.

In Steps S50 to S80, a process for estimating the charge amount difference of the plurality of secondary batteries 31 (state estimation method) is executed based on the voltage values recorded in S40. Steps S50 to S80 will be described with reference to one example of temporal change of the voltage values of the four secondary batteries 31 (see FIG. 5). FIG. 5 shows a chart showing the temporal change of the voltage values of the secondary batteries 31 at the ending stage of constant current charging. Here, the values shown in FIG. 5 are mere examples, and may not limit this embodiment. Further, FIG. 5 shows the four secondary batteries 31 having different voltage values (thus, charge amounts). In the following description, the four secondary batteries 31 are identified by reference numbers 31A-31D in descending order according to the voltage.

<Specific Voltage Setting Process>

Next, the CPU 61 sets, as a specific voltage V0, a voltage of the secondary battery 31D whose voltage is lowest (e.g., 3.529 V in FIG. 5) at a time point at which the constant current charging ends (hereinafter referred to as the reference time point T0, see FIG. 5) (S50). Here, the secondary battery 31D is one example of a "lowest-voltage energy storage device" and a "low-voltage energy storage device". Further, each of the secondary batteries 31A-31C is one example of a "high-voltage energy storage device". Moreover, the reference time point T0 is one example of the "reference time point during the constant current charging". In this embodiment, a state for completion of charging is, but not limited to, a voltage of the secondary battery 31A whose voltage is highest reaching 3.61 V.

<Time Obtaining Process>

Next, the CPU 61 obtains time points T1-T3 respectively at which voltages of the secondary batteries 31A-31C other than the secondary battery 31D reach the specific voltage V0 (S60).

<Time Difference Calculating Process>

Next, the CPU 61 calculates time differences DT1-DT3 respectively between the reference time point T0 and the time points T1-T3 obtained in the time obtaining process (S70). The time differences DT1-DT3 are calculated based on the following expressions (1) to (3), respectively.

$$\text{Time Difference } DT1 = \text{Time } T0 - \text{Time } T1 \quad (1)$$

$$\text{Time Difference } DT2 = \text{Time } T0 - \text{Time } T2 \quad (2)$$

$$\text{Time Difference } DT3 = \text{Time } T0 - \text{Time } T3 \quad (3)$$

<Charge Amount Difference Estimating Process>

Next, the CPU 61 estimates the charge amount differences between the secondary battery 31D and the respective secondary batteries 31A-31C based on the time differences DT1-DT3 (S80). Each of the charge amount differences may be obtained by multiplying the time difference by the charge current. Specifically, in the case where the charge amount difference between the secondary battery 31D and the secondary battery 31A is DC1, the charge amount difference between the secondary battery 31D and the secondary batteries 31B is DC2, and the charge amount difference between the secondary battery 31D and the secondary batteries 31C is DC3, the charge amount differences DC1-DC3 are calculated based on the following expressions (4) to (6), respectively.

$$\text{Charge Amount Difference } DC1 = \text{Time Difference } DT1 * \text{Charge Current } ZI \quad (4)$$

$$\text{Charge Amount Difference } DC2 = \text{Time Difference } DT2 * \text{Charge Current } ZI \quad (5)$$

$$\text{Charge Amount Difference } DC3 = \text{Time Difference } DT3 * \text{Charge Current } ZI \quad (6)$$

In the above expressions (4) to (6), the charge current ZI is a current flowing through the assembled battery 30 during constant current charging, and measured, for example, by the current sensor 40.

<Equalization Process>

Next, the CPU 61 equalizes the charge amounts of the secondary batteries 31 by activating the discharging circuit 70 (S90). Specifically, the CPU 61 calculates discharge periods of the secondary batteries 31A-31C respectively based on the charge amount differences DC1-DC3 and the discharge current that has been set, and turns the discharge switch SW corresponding to the secondary batteries 31A-31C on only during the discharge period to perform discharge separately. With this, the secondary batteries 31A-31C are discharged, and the charge amounts of these batteries are equalized with the charge amount of the secondary battery 31D.

3. Effects of this Embodiment

Next, effects of this embodiment will be described. As described above, by setting the voltage of the secondary battery 31D whose voltage is the lowest at the reference time point T0 as the specific voltage V0, the time points T1-T3 at which the voltages of the other secondary batteries 31A-31C having a voltage higher than the secondary battery 31D have reached the specific voltage V0 may be reliably obtained as the voltages of these batteries have already reached the specific voltage V0. With this, it is possible to reliably obtain the time differences DT1-DT3 relating to the time points T1-T3 at which the voltages of the batteries have reached the specific voltage V0, and to estimate the charge amount differences DC1-DC3 between the plurality of secondary batteries 31 based on the time differences DT1-DT3.

Here, if a static value is taken as the specific voltage, the following problems are conceivable. For example, if the specific voltage is set to a static value that is relatively high (e.g., 3.55 V as shown in FIG. 5), the voltage of the secondary batteries 31 whose voltage is low (e.g., the secondary battery 31D) may not reach the specific voltage. As a result, it is not possible to estimate the charge amount differences between the secondary battery 31D and the other secondary batteries 31. Considering the above situation, if the specific voltage is set to a lower static value (e.g., 3.45 V as shown in FIG. 5), it is difficult to estimate the charge amount differences as there is only a very small difference between the voltages of the secondary batteries 31. By contrast, according to this embodiment, the most suitable specific voltage V0 is set based on the voltage value measured during constant current charging, and therefore it is possible to reliably estimate the charge amount differences for the plurality of secondary batteries 31.

Second Embodiment

Next, a second embodiment will be described with reference to FIG. 6 and FIG. 7. This embodiment is different from the first embodiment in the sequence for executing the equalization control. Here, like components as those in the first embodiment are denoted by like reference numbers. The sequence for executing the equalization control shown in FIG. 6 includes Steps S110 to S200. Further, in the following description, temporal change of voltage values of the four secondary batteries 31 (reference numbers 31A-31D) in an ending stage of charging (see FIG. 7) is taken as one example.

<Process During Constant Current Charging>

Figure 6:
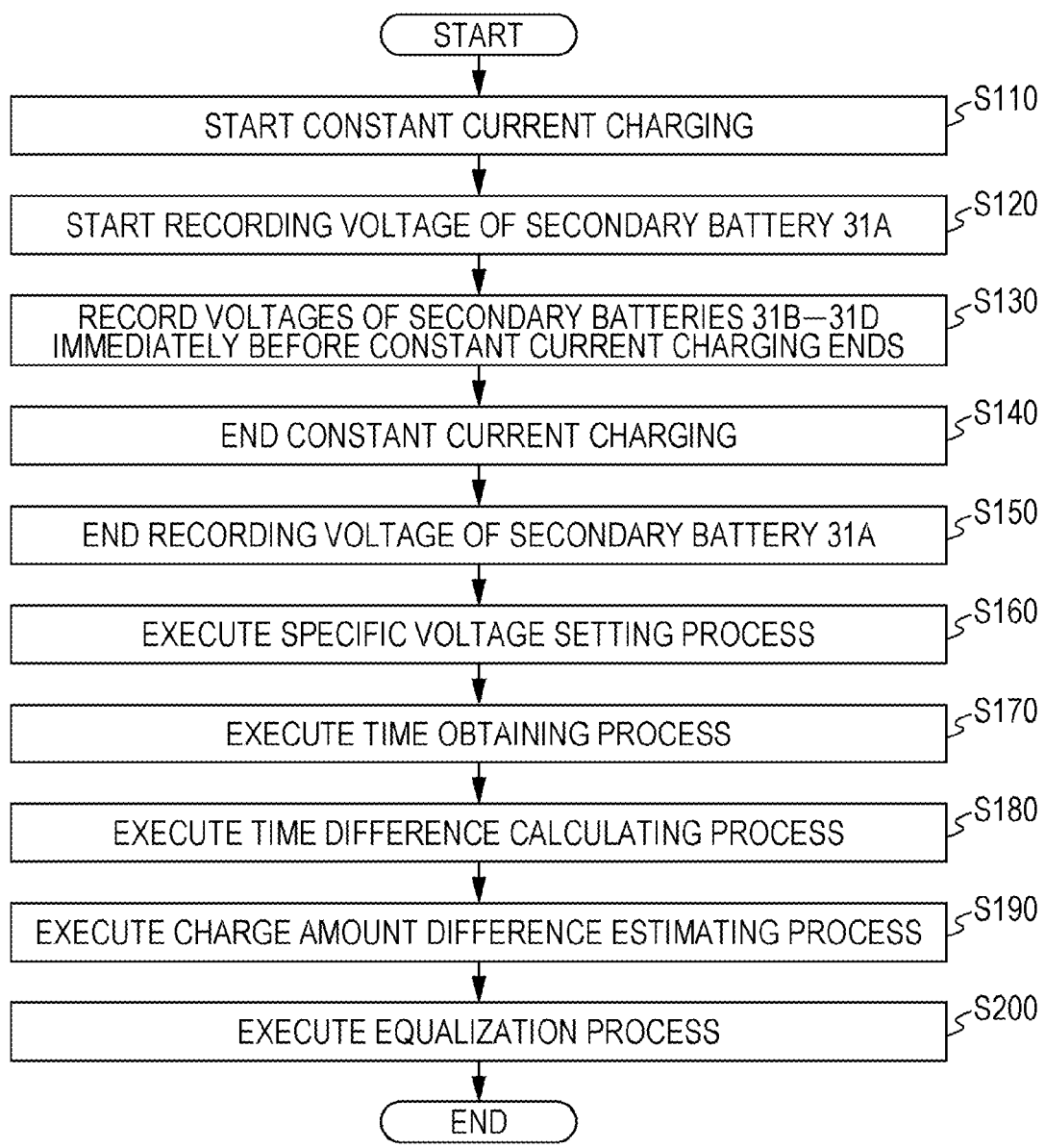
FIG. 6 shows a flowchart showing a process for equalization control according to a second embodiment.
Figure 7:
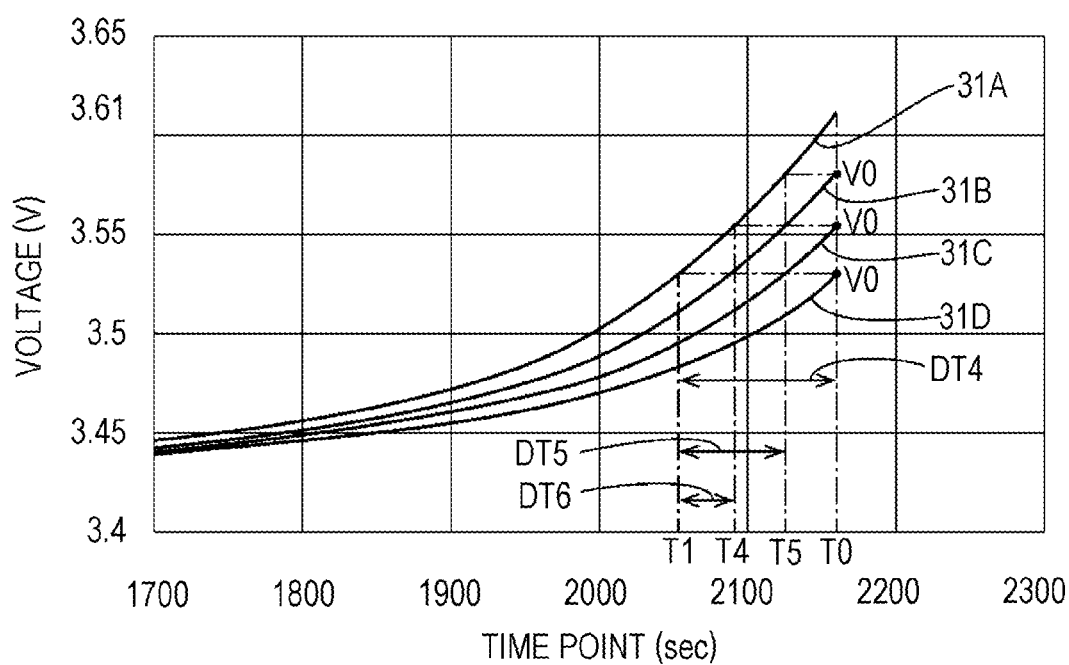
FIG. 7 shows a chart showing temporal change of voltage values of the secondary batteries at an ending stage of constant current charging according to the second embodiment.

As illustrated in FIG. 6, when the assembled battery 30 is connected to the battery charger 11 by an operator and constant current charging of the assembled battery 30 from the battery charger 11 starts (S110), the CPU 61 records a voltage value of the secondary battery 31A whose voltage is highest in the memory 63 (S120). Further, for the secondary batteries 31B-31D, the CPU 61 records voltages immediately before the constant current charging ends in the memory 63 (S130). Then, upon completion of the constant current charging of the assembled battery 30 from the battery charger 11 (S140), the CPU 61 stops recording of the voltage value of the secondary battery 31A (S150).

<Specific Voltage Setting Process>

Next, the CPU 61 sets, as the specific voltage V0, voltages respectively of the secondary batteries 31B-31D (the secondary batteries other than the secondary battery 31A) at the reference time point T0 when the constant current charging ends (see FIG. 7) (S160). Here, the secondary battery 31A is one example of the "highest-voltage energy storage device" and the "high-voltage energy storage device". Further, each of the secondary batteries 31B-31C is one example of the "low-voltage energy storage device", and the secondary battery 31D is one example of the "lowest-voltage energy storage device" and the "low-voltage energy storage device".

<Time Obtaining Process>

Next, the CPU 61 obtains time points (time points T1, T4, and T5) respectively at which the voltage of the secondary battery 31A reaches the specific voltage V0 (S170). At the time point T1 shown in FIG. 7, the voltage of the secondary battery 31A reaches the voltage of the secondary battery 31D at the reference time point T0 (the specific voltage V0 for the secondary battery 31D). Specifically, the time point T1 (first time point) is one example of a "time point at which the voltage of the highest-voltage energy storage device reaches the specific voltage V0 of the lowest-voltage energy storage device". Further, at the time point T4 shown in FIG. 7, the voltage of the secondary battery 31A reaches the voltage of the secondary battery 31C at the reference time point T0 (the specific voltage V0 for the secondary battery 31C). Moreover, at the time point T5 shown in FIG. 7, the voltage of the secondary battery 31A reaches the voltage of the secondary battery 31B at the reference time point T0 (the specific voltage V0 for the secondary battery 31B).

<Time Difference Calculating Process>

Next, the CPU 61 calculates the time differences DT4-DT6 between the time point T1 and the reference time point T0, the time point T5, and the time point T4, respectively (S180). Specifically, in this embodiment, the time differences based on the time point T1 are calculated. The time differences DT4-DT6 are calculated based on the following expressions (7) to (9), respectively. Here, the time point T5 and the time point T4 are one examples of a "time point other than the time point T1 obtained in the time obtaining process", respectively.

$$DT4 = T0 - T1 \tag{7}$$

$$DT5 = T5 - T1 \tag{8}$$

$$DT6 = T4 - T1 \tag{9}$$

<Charge Amount Difference Estimating Process>

Next, the CPU 61 estimates the charge amount differences between the secondary battery 31D and the respective secondary batteries 31A-31C based on the time differences DT4-DT6 and the charge current (S190). Specifically, where the charge amount difference between the secondary battery 31D and the secondary battery 31A is DC4, the charge amount difference between the secondary battery 31D and the secondary battery 31B is DC5, and the charge amount difference between the secondary battery 31D and the secondary battery 31C is DC6, the charge amount differences DC4-DC6 are calculated based on the following expressions (10) to (12), respectively.

$$\text{Charge Amount Difference } DC4 = \text{Time Difference } DT4 * \text{Charge Current } ZI \tag{10}$$

$$\text{Charge Amount Difference } DC5 = \text{Time Difference } DT5 * \text{Charge Current } ZI \tag{11}$$

$$\text{Charge Amount Difference } DC6 = \text{Time Difference } DT6 * \text{Charge Current } ZI \tag{12}$$

<Equalization Process>

Next, the CPU 61 equalizes the charge amounts of the secondary batteries 31 by activating the discharging circuit 70 (S200). Specifically, the CPU 61 calculates discharge periods of the secondary batteries 31A-31C respectively based on the charge amount differences DC4-DC6 and the discharge current that has been set, and turns the discharge switch SW corresponding to the secondary batteries 31A-31C on only during the discharge period to perform discharge separately. With this, the secondary batteries 31A-31C are discharged, and the charge amounts of these batteries are equalized with the charge amount of the secondary battery 31D.

Next, effects of this embodiment will be described. In this embodiment, the specific voltage V0 is set for each of the secondary batteries 31B-31C, and the time points at which the voltage of the secondary battery 31A reaches each of the specific voltages are calculated. With this, it is possible to estimate the charge amount differences based on the time differences at the calculated time points.

Further, in order to estimate the charge amount differences based on the time differences, it is necessary to obtain the time points at which the voltages of the secondary batteries 31 reach the specific voltage V0, and therefore, to record the temporal change of the voltages of the secondary batteries 31. According to the first embodiment described above, it is necessary to obtain the time points at which the voltages of the secondary batteries 31A, 31B, and 31C reach the specific voltage V0, and to record the temporal change of the voltages of the secondary batteries 31A, 31B, and 31C. By contrast, according to this embodiment, it is necessary to obtain only the temporal change of the voltage of the secondary battery 31A whose voltage is highest, and therefore it is possible to reduce an amount of data to be recorded.

Third Embodiment

Figure 8:
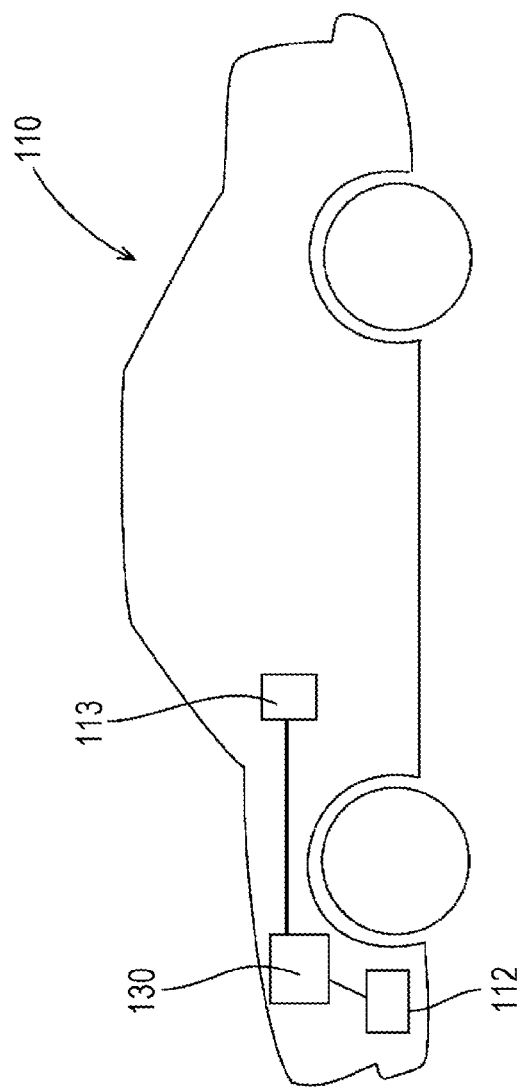
FIG. 8 shows a view illustrating an automobile according to a third embodiment.

Next, a third embodiment in which the technique disclosed herein is applied to vehicles such as an automobile 110 will be described with reference to FIG. 8 through FIG. 11. Here, like components as those in the embodiments described above are denoted by like reference numbers. As illustrated in FIG. 8, the automobile 110 includes a vehicle load 112, a battery module 130 (energy storage module) connected to the vehicle load 112, a vehicle-side electronic control 113 (ECU) that controls an operation of the vehicle load 112, and a power generator 111 for vehicle (see FIG. 9). Here, examples of the vehicle load 112 include a starter motor for staring an engine, a headlight, an interior light, an audio device, a clock, and a security device.

Figure 9:
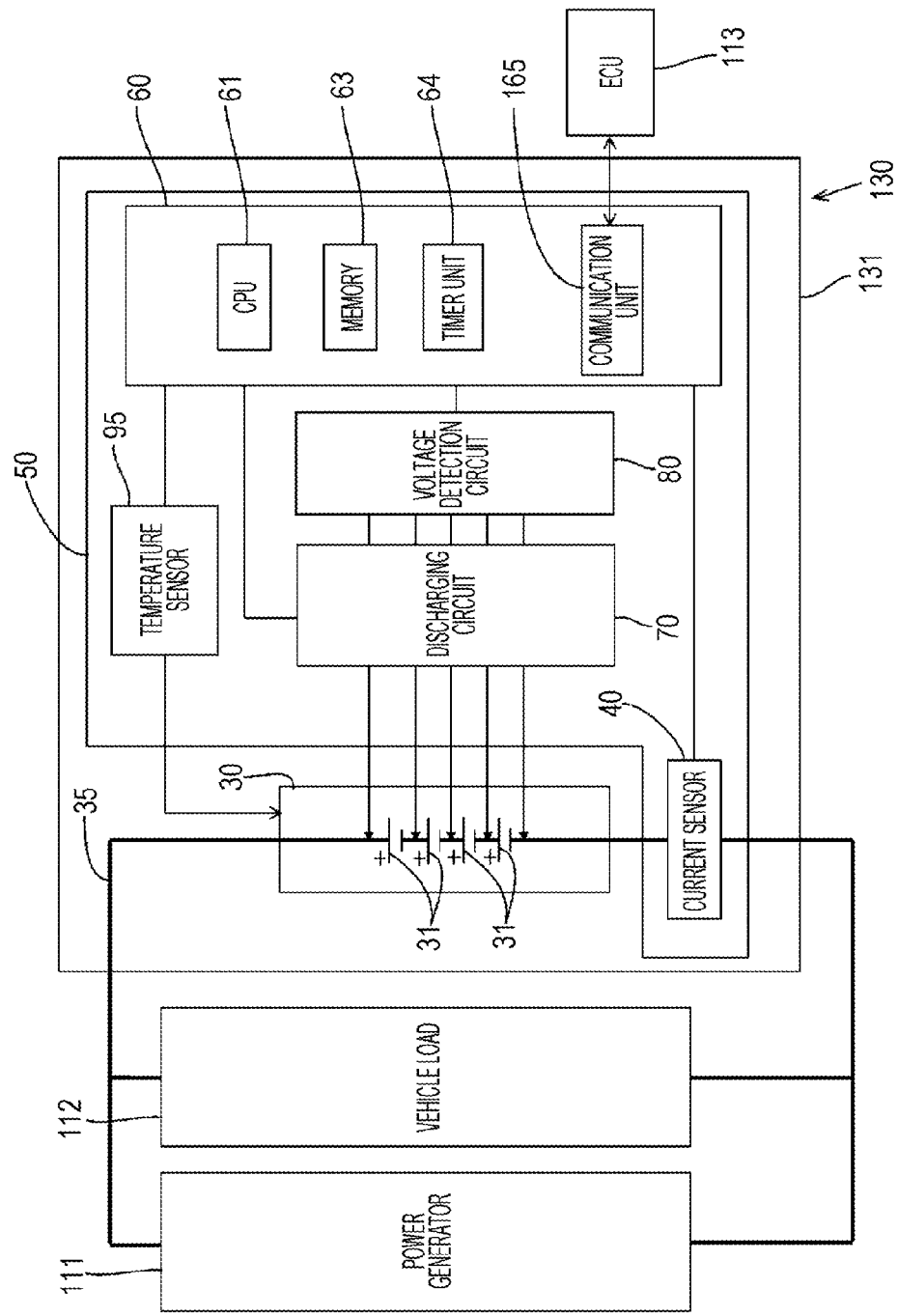
FIG. 9 shows a block diagram illustrating a battery module according to the third embodiment.

Further, as illustrated in FIG. 9, the vehicle load 112 is connected to the battery module 130 and the power generator 111, and configured to operate by being supplied with power from the battery module 130 and the power generator 111. Moreover, the power generator 111 is configured to generate power by being rotated according to driving of the engine of the automobile 110. Furthermore, if an amount of power generation by the power generator 111 is larger than an amount of power consumption by the vehicle load 112, for example, during traveling of the vehicle, power is supplied to the vehicle load 112 from the power generator 111 and the battery module 130 is charged by surplus power. Specifically, the power generator 111 serves a function as the battery charger for charging the battery module 130.

The vehicle-side electronic control 113 is connected to the vehicle load 112, the power generator 111, the battery module 130, and the like via a communication line, and controls the vehicle load 112 based on a state of the automobile 110, a state of the battery module 130, and the like.

As illustrated in FIG. 9, the battery module 130 according to this embodiment includes the plurality of secondary batteries 31, the BM 50, and a battery case 131 for housing the plurality of secondary batteries 31 and the BM 50. Further, the controller 60 according to this embodiment includes a communication unit 165 capable of performing communication with the vehicle-side electronic control 113.

Figure 10:
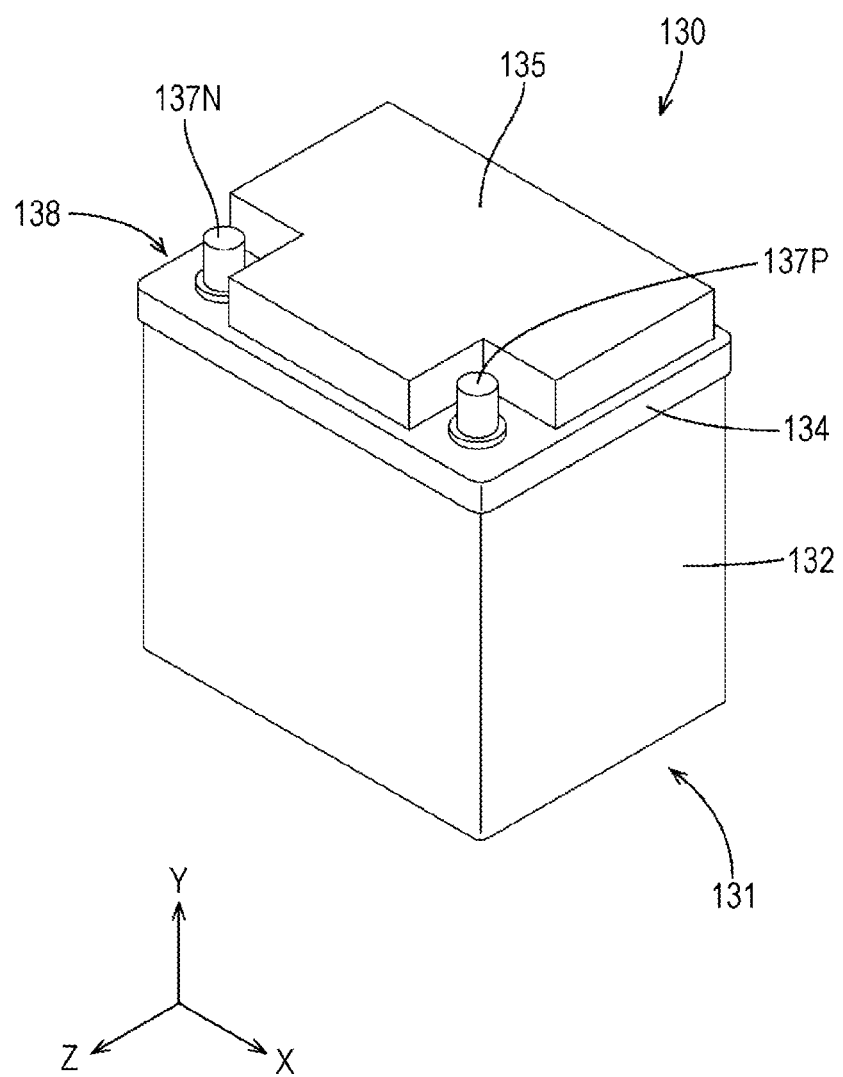
FIG. 10 shows a perspective view illustrating the battery module.
Figure 11:
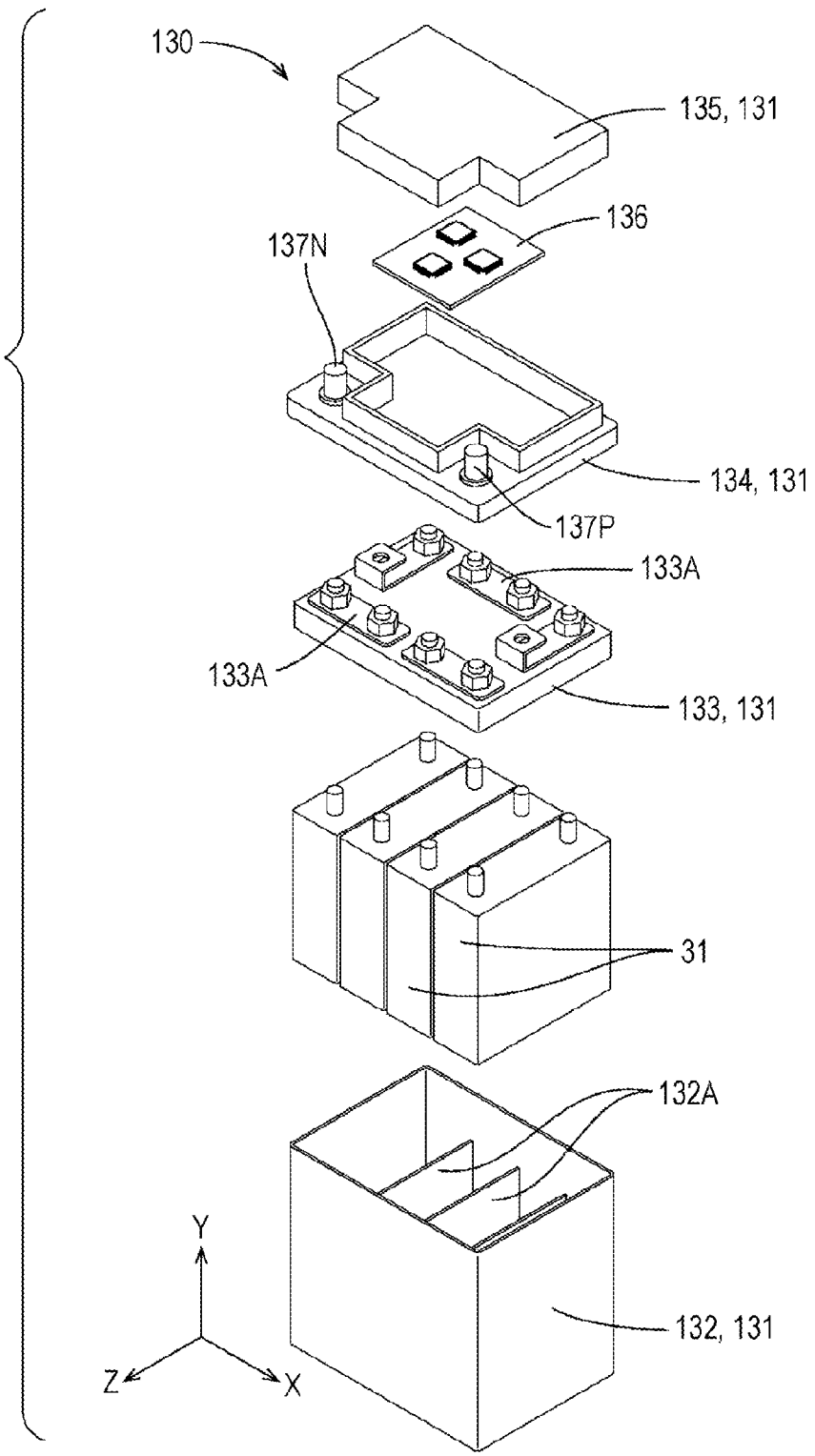
FIG. 11 shows an exploded perspective view illustrating the battery module.

The battery case 131 is made, for example, of a synthetic resin, and in a block shape as illustrated in FIG. 10. Further, as illustrated in FIG. 11, the battery case 131 includes a case main body 132 having an opening on a top side, a positioning member 133 for positioning the plurality of secondary batteries 31, an inner cover 134 attached on top of the case main body 132, and an upper cover 135 attached on top of the inner cover 134. Here, in FIG. 10 and FIG. 11, in a state in which the battery case 131 is placed without inclining with respect to an installation surface, a vertical direction of the battery case 131 is taken as a Y-axis direction, a direction along a length of the battery case 131 is taken as an X-axis direction, and a depth direction of the battery case 131 is taken as a Z-axis direction.

As illustrated in FIG. 11, within the case main body 132, a plurality of cell chambers 132A respectively containing the plurality of secondary batteries 31 are arranged along the X-axis direction. On an upper surface of the positioning member 133, a plurality of bus bars 133A are disposed. By providing the positioning member 133 above the plurality of secondary batteries 31 within the case main body 132, the plurality of secondary batteries 31 are positioned and connected in series via the plurality of bus bars 133A.

As illustrated in FIG. 11, the inner cover 134 may contain a circuit board 136 therein. The circuit board 136 is configured to constitute, but not limited to, the controller 60 and the voltage detection circuit 80 in the BM 50, for example. Here, the discharging circuit 70, the current sensor 40, and the temperature sensor 95 are not illustrated in FIG. 11.

As illustrated in FIG. 10, an upper wall 138 of the battery case 131 is substantially in a rectangular shape in planar view, and constituted by the inner cover 134 and the upper cover 135. The upper wall 138 is in a stepped form in which a portion constituted by the inner cover 134 is lower than a portion constituted by the upper cover 135. The lower portion of the upper wall 138 (the inner cover 134) includes a pair of terminal sections 137 to which harness terminals (not illustrated) are connected and which are disposed on both ends in the X-axis direction. The terminal sections 137 are made of a metal such as a lead alloy, and a lower part of each of the terminal sections is embedded in the inner cover 134. Here, one of the pair of terminal sections 137 is a positive-side terminal section 137P, and the other is a negative-side terminal section 137N.

As described above, in this embodiment, the BM 50 and the plurality of secondary batteries 31 are contained in the battery case 131. With this, it is possible to perform the sequence for executing the equalization control described in the first and the second embodiments to the battery module 130 installed on the automobile 110.

OTHER EMBODIMENTS

Aspects of the technique disclosed herein are not limited to the embodiments in the above description with reference to the drawings, and may include various aspects as described below.

(1) In the above embodiments, a lithium ion secondary battery using an iron-phosphate-based positive active material is taken as one example of the energy storage device. However, the technique disclosed herein is not limited to the example described above, and a secondary battery other than lithium ion secondary battery or an electrochemical cell such as a capacitor associated with electrochemical phenomena may be employed as the energy storage device.

(2) In the above embodiments, the controller 60 having the CPU 61 is taken as an example, but the technique disclosed herein is not limited to the example described above. The controller may have a configuration in which a plurality of CPUs are provided, or may be a hardware circuit such as an ASIC (Application Specific Integrated Circuit), or may be a microcomputer, an FPGA, an MPU, or a combination thereof. In other words, the controller may have any configuration capable of executing the sequence for executing the equalization control described in the above embodiments utilizing a software or hardware circuit.

(3) In the above embodiments, the configuration in which the assembled battery 30 includes the four secondary batteries 31 is taken as an example, but the technique disclosed herein is not limited to the example described above. As long as at least two secondary batteries 31 are provided, the number may be changed as appropriate.

(4) In the above embodiments, the case in which the constant current charging is performed to the assembled battery 30 and then the equalization process is performed based on the result of the constant current charging is taken as an example, but the technique disclosed herein is not limited to the example described above. For example, a case in which constant current constant voltage charging is performed to the assembled battery 30 and then the equalization process is performed based on a result of the constant current constant voltage charging. Here, when constant current constant voltage charging is performed, it is conceivable that degrees (high and low) of the voltages of the secondary batteries 31 when the constant current charging ends and degrees (high and low) of the voltages of the secondary batteries 31 during the constant voltage charging become opposite, due to individual variability in internal resistances provided respectively for the secondary batteries 31. In such a case, the charge amount differences estimated based on the voltages of the secondary batteries 31 when the constant current charging ends may be corrected, and the equalization process may be performed based on the corrected value.

(5) In the above embodiments, the method of equalizing the charge amounts by discharging one of the secondary batteries 31 whose charge amount is relatively large is taken as an example, but the technique disclosed herein is not limited to the example described above. For example, the charge amounts may be equalized by charging one of the secondary batteries 31 whose charge amount is relatively small from another of the secondary batteries 31 whose charge amount is relatively large. However, in a case in which charging is performed only between the plurality of secondary batteries 31 and without receiving power supply from an external power source, charging one of the secondary batteries 31 leads to reduction of the charge amounts of the other secondary batteries 31, and therefore the process of equalization becomes complicated. By contrast, performing equalization by discharging is advantageous because it is possible to facilitate equalization of all the secondary batteries by discharging other secondary batteries based on, for example, a secondary battery whose charge amount is smallest.

(6) In the above embodiments, the case in which the charge amount differences with the other secondary batteries 31 are estimated based on the secondary battery 31D whose voltage is lowest is taken as an example, but the technique disclosed herein is not limited to the example described above.

(7) In the above embodiments, the time point at which the constant current charging ends is set as the reference time point T0, but the technique disclosed herein is not limited to the example described above. While the reference time point T0 may be set as appropriate as long as it is a time point during the constant current charging, it is preferable to set a time point at which voltage differences between the secondary batteries 31 are clear in order to improve accuracy in estimation of the charge amount differences. Specifically, it is preferable that a time point in a time zone in which the plurality of secondary batteries 31 are in a high-change region (e.g., the ending stage of charging) is set as the reference time point T0, as this makes voltage differences between the secondary batteries 31 clear.

It should be noted that there is an inflection point at which a change rate of OCV of the secondary batteries 31 is over a predetermined value between the low-change region and the high-change region. Therefore, if the reference time point T0 is set in a time zone during which the voltage of one of the secondary batteries 31 whose voltage is lowest (the secondary battery 31D) exceeds a voltage corresponding to the inflection point, voltage differences between the secondary batteries 31 become clear as the plurality of secondary batteries 31 are in the high-change region, and it is possible to more reliably estimate the charge amount differences.

(8) In the third embodiment, the case in which the battery module (energy storage module) is mounted on a vehicle and the battery module is connected to vehicle loads including a starter motor, a headlight, an interior light, an audio device, a clock, and a security device is taken as an example. Alternatively, the present invention may be applied for estimating a state of an energy storage device mounted on a two-wheeled vehicle, a railroad vehicle, an uninterruptable power supply (UPS), a regenerative power receiving apparatus, an energy storage apparatus for power generation by natural energy, or the like. A part or the whole functions of the state estimation device may be located at a distant place, and the state estimation device may be connected to an energy storage device or an energy storage module through a network. Furthermore, the state estimation device may be implemented on a server in a network.

What is claimed is:

1. A state estimation device that estimates a state of a plurality of energy storage devices, the state estimation device comprising:
   a voltage detecting unit configured to detect voltages of the energy storage devices, respectively; and
   an estimating unit configured to estimate a charge amount difference between at least two of the energy storage devices,
   wherein at a reference time point T0 during constant current charging to the plurality of energy storage devices, in a case in which one of the two energy storage devices is a low-voltage energy storage device whose voltage is relatively low, and the other of the two energy storage devices is a high-voltage energy storage device whose voltage is relatively high, the estimating unit performs:
   a specific voltage setting process for setting, as a specific voltage V0, a voltage of the low-voltage energy storage device detected by the voltage detecting unit at the reference time point T0;
   a time obtaining process for obtaining a time point at which a voltage of the high-voltage energy storage device reaches the specific voltage V0; and
   a charge amount difference estimating process for estimating the charge amount difference between the at least two energy storage devices based on the reference time point T0, the time point obtained in the time obtaining process, and a current flowing through the plurality of energy storage devices during the constant current charging.

2. The state estimation device according to claim 1, wherein the plurality of energy storage devices include three or more energy storage devices, and
   in a case in which one of the plurality of energy storage devices is a lowest-voltage energy storage device whose voltage is lowest at the reference time point T0, the estimating unit:
   sets, in the specific voltage setting process, a voltage of the lowest-voltage energy storage device as the specific voltage V0;

obtains, in the time obtaining process, time points at which voltages of the plurality of energy storage devices other than the lowest-voltage energy storage device reach the specific voltage V0; and estimates, in the charge amount difference estimating process, the charge amount differences between the plurality of energy storage devices based on the reference time point T0, the time points obtained in the time obtaining process, and a current flowing through the plurality of energy storage devices during the constant current charging.

3. The state estimation device according to claim 2, wherein the estimating unit:

performs a time difference calculating process for calculating time differences between the reference time point T0 and the time points obtained in the time obtaining process; and estimates, in the charge amount difference estimating process, the charge amount differences between the lowest-voltage energy storage device and the energy storage devices other than the lowest-voltage energy storage device based on the time differences calculated in the time difference calculating process.

4. The state estimation device according to claim 1, wherein the plurality of energy storage devices include three or more energy storage devices, and in a case in which one of the plurality of energy storage devices is a highest-voltage energy storage device whose voltage is highest at the reference time point T0, the estimating unit:

sets, in the specific voltage setting process, voltages of the plurality of energy storage devices other than the highest-voltage energy storage device as specific voltages V0;

obtains, in the time obtaining process, time points at which a voltage of the highest-voltage energy storage device reaches the specific voltages V0 that have been set in the specific voltage setting process; and estimates, in the charge amount difference estimating process, the charge amount differences between the plurality of energy storage devices based on the reference time point T0, the time points obtained in the time obtaining process, and a current flowing through the plurality of energy storage devices during the constant current charging.

5. The state estimation device according to claim 4, wherein in a case in which one of the plurality of energy storage devices a lowest-voltage energy storage device whose voltage is lowest at the reference time point T0, the estimating unit:

performs a time difference calculating process for calculating a time difference between the time point T1 and the reference time point T0 and time differences between the time point T1 and the time points other than the time point T1 obtained in the time obtaining process, the time point T1 being a time point at which a voltage of the highest-voltage energy storage device reaches the specific voltage V0 of the lowest-voltage energy storage device; and estimates, in the charge amount difference estimating process, the charge amount differences between the lowest-voltage energy storage device and the energy storage devices out of the plurality of energy storage devices other than the lowest-voltage energy storage device, based on the time differences calculated in the time difference calculating process.

6. An energy storage module comprising:
a plurality of energy storage devices; and
the state estimation device according to claim 1.

7. A vehicle comprising:
the energy storage module according to claim 6; and
a vehicle load to which power is supplied from the energy storage module.

8. A state estimation method for estimating a state of a plurality of energy storage devices, the method comprising:

setting, at a reference time point T0 during constant current charging to the plurality of energy storage devices, a voltage of a low-voltage energy storage device as a specific voltage V0, wherein one of at least two of the plurality of energy storage devices is the low-voltage energy storage device whose voltage is relatively low and the other of the two energy storage devices is a high-voltage energy storage device whose voltage is relatively high;

obtaining a time point at which a voltage of the high-voltage energy storage device reaches the specific voltage V0; and estimating a charge amount difference between the at least two energy storage devices based on the reference time point T0, the time point obtained in the time obtaining, and a current flowing through the plurality of energy storage devices during the constant current charging.

* * * * *